(12) United States Patent
Bennett

(10) Patent No.: US 7,220,943 B2
(45) Date of Patent: May 22, 2007

(54) RF STAND OFFS

(75) Inventor: Paul Bennett, Bristol (GB)

(73) Assignee: Aviza Technology Limted, Newport, Gwent (GB)

( * ) Notice: Subject to any disclaimer, the term of this patent is extended or adjusted under 35 U.S.C. 154(b) by 279 days.

(21) Appl. No.: 11/088,193

(22) Filed: Mar. 24, 2005

(65) Prior Publication Data

US 2005/0211690 A1 Sep. 29, 2005

Related U.S. Application Data

(60) Provisional application No. 60/556,471, filed on Mar. 26, 2004.

(51) Int. Cl.
*H05B 1/00* (2006.01)

(52) U.S. Cl. ..................................... 219/201
(58) Field of Classification Search ............... 219/201; 392/301, 304
See application file for complete search history.

(56) References Cited

U.S. PATENT DOCUMENTS

| | | | |
|---|---|---|---|
| 5,138,973 A * | 8/1992 | Davis et al. .......... | 118/723 MP |
| 5,383,984 A * | 1/1995 | Shimada et al. ....... | 156/345.26 |
| 5,478,429 A | 12/1995 | Komino et al. | |
| 5,681,418 A * | 10/1997 | Ishimaru ................ | 156/345.37 |
| 5,725,675 A | 3/1998 | Fong et al. | |
| 5,997,649 A * | 12/1999 | Hillman ...................... | 118/715 |
| 6,056,823 A * | 5/2000 | Sajoto et al. ............... | 118/715 |
| 6,150,283 A * | 11/2000 | Ishiguro ..................... | 438/758 |
| 6,443,191 B1 * | 9/2002 | Murayama et al. .......... | 141/65 |
| 6,451,388 B1 * | 9/2002 | Tada et al. .................. | 427/576 |
| 6,481,370 B2 * | 11/2002 | Kazumi et al. ........... | 118/723 I |
| 6,849,857 B2 * | 2/2005 | Ichiki et al. ............ | 250/492.21 |

FOREIGN PATENT DOCUMENTS

GB 2412485 A * 9/2005

\* cited by examiner

*Primary Examiner*—Robin D. Evans
*Assistant Examiner*—Vinod Patel
(74) *Attorney, Agent, or Firm*—Volentine & Whitt, PLLC

(57) ABSTRACT

This invention relates to RV stand offs or breaks and in particular, but not exclusively not to stand offs which are suitable for use in plasma generating apparatus. A stand off 14 includes a resistive or insulating cylinder 15, through which gas feeds are drilled and a close coupled helically wound combination, generally indicated at 16. This combination 16 comprises an RF conductive tube 17 in the form of a braided cable; a thermocouple 18 having twisted pair supply cables 19 and a heater element 20 in the form of a cable loop or pair.

19 Claims, 2 Drawing Sheets

RF STAND OFFS

CROSS REFERENCE TO RELATED APPLICATIONS

A claim to priority is made to U.S. Provisional application No. 60/556,471 filed Mar. 26, 2004.

BACKGROUND OF INVENTION

1. Field of Invention

This invention relates to RF stand offs or breaks and in particular, but not exclusively, to stand offs, which are suitable for use in plasma generating apparatus.

2. Background of the Invention

In RF plasma vacuum processing equipment, it is often necessary to provide a gas feed to a live RF part. For example, helium may be required for backside cooling of an RF driven wafer chuck or a process gas may need to be fed to an RF driven showerhead. In the latter case, the gasses used may only be gaseous at elevated temperature and this means that the gas lines require heating throughout the gas delivery system including, ideally, any insulating or resistive pipe work used as part of an RF stand off.

The problems that can occur in controlling the RF Field strength in the gas feed and trying to ensure the RF voltage is evenly dropped along its length are discussed in U.S. Pat. No. 5,725,675, which uses a resistive potential divider approach to ensure even dropping of the RF voltage.

However, the solutions discussed do not provide for directed heating of the insulating or resistive gas feed and this is because, until now, it has been thought necessary to use bulky and costly RF blocking inductors to prevent RF being picked up by either or both the heating element or thermocouple and being fed back to heater power supplies and control electronics with potentially damaging consequences. Indirect heating, for example hot air blowing, has been considered, but in many cases is not practical.

SUMMARY OF INVENTION

The invention consists in an RF stand off including a resistive or insulating gas feed for extending between a grounded part of an apparatus and an RF part and a close coupled combination of an electrical heater, an electrical temperature sensor having supply cables and an RF conductor for extending between the grounded part and the RF live part; the combination being generally helically wound around the gas feed and the heater and/or its cables and the supply cables being respectively substantially co-extensive and close coupled such that voltage induced by RF in one cable is substantially balanced out by an equal and opposite voltage in another.

Preferably the pitch of the turns of the helical winding are chosen to allow an even voltage drop per unit length along the gas feed and, as will be explained in more detail below, the voltage decay along the gas feed can also be influenced by the arrangement of the grounded part which surrounds it.

The temperature sensor may project from the close couple combination at or adjacent the point at which it senses temperature. Conveniently this is at or adjacent the mid point of the stand off.

The combination may be in the form of a twisted trio, parallel tapes or the RF conductor may be formed, at least in part, by a conductive tube and the electrical heater and the sensor and cables may be at least in part contained therein.

In this last arrangement the end of the tube which is to be connected to the RF live part may be closed. The tube is conveniently in the form of a braided cable, so that the combination is effectively similar to a co-axial construction. In these cases the sensor may project through an opening in the tube.

The stand off may further include a DC bias blocking capacitor for connection in series between the RF conductor and the RF live part.

The invention also includes an RF apparatus including a grounded part and a RF live part interconnected by a stand off as defined above.

In that case the grounded part may define a recess or well for receiving the RF stand off and thereby shielding it. Indeed the grounded part may advantageously be chosen also to promote transmission line effects and an even voltage distribution. The resultant structure could be classified as a "slow wave" structure and provides a linear voltage decay along the rods length and thus a minimum and even electrical field, which is selected to be below the ignition threshold of the gas, which is to be fed.

Although the invention has been defined above, it is to be understood that the invention includes any inventive combination of the features set out above or in the following description.

BRIEF DESCRIPTION OF THE DRAWINGS

The invention may be performed in various ways and specific embodiments will now be described, by way of example, with reference to the accompanying drawings in which:

In FIG. 1 an apparatus includes a grounded part 10, a spaced RF part 11 and gas input and output lines 12, 13 respectively. An RF stand off incorporating a gas feed is generally indicated at 14.

Figure 1:
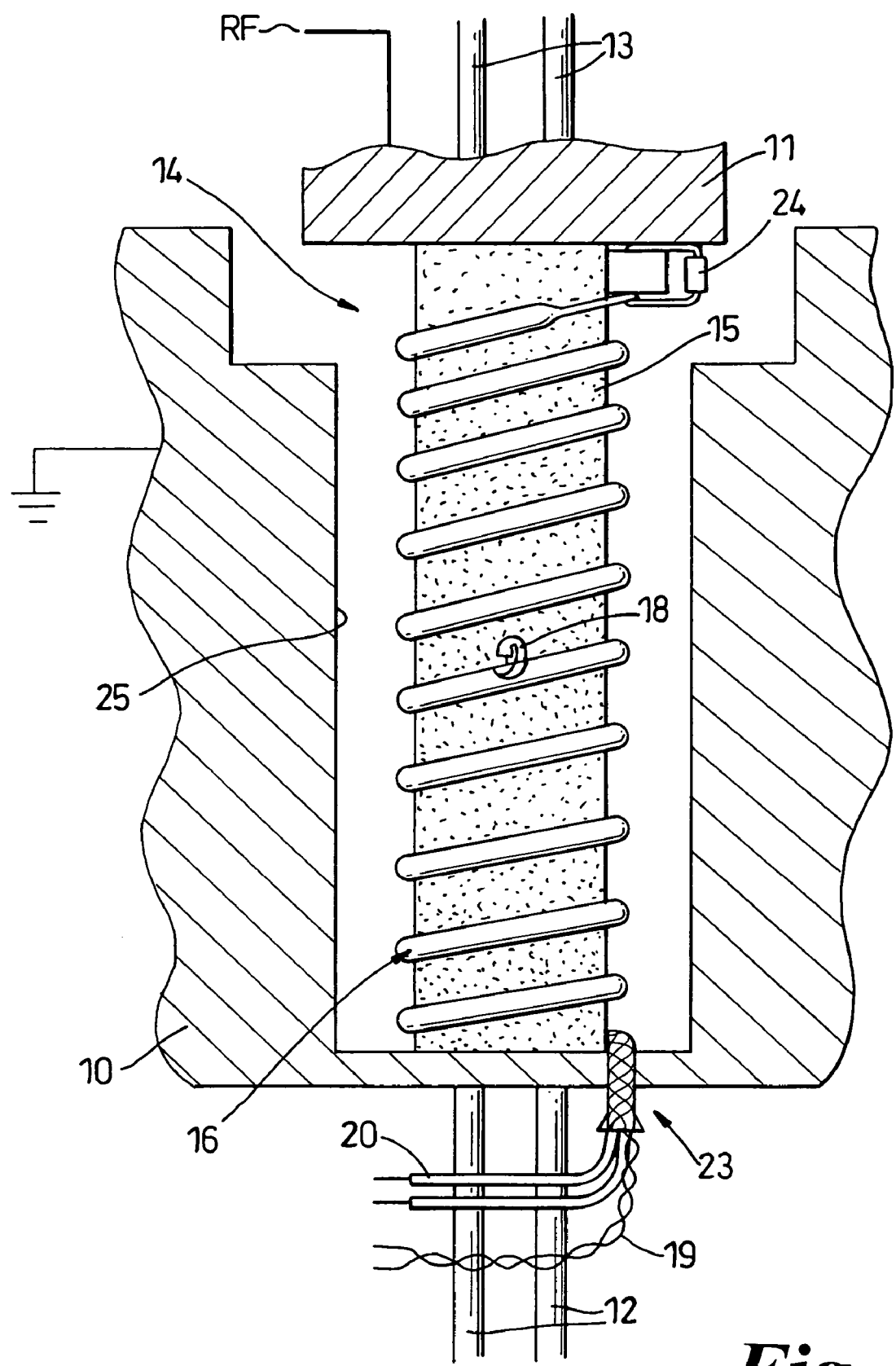
FIG. 1 is a scrap cross-sectional view through a part of an RF apparatus showing an RF stand off.
Figure 2:
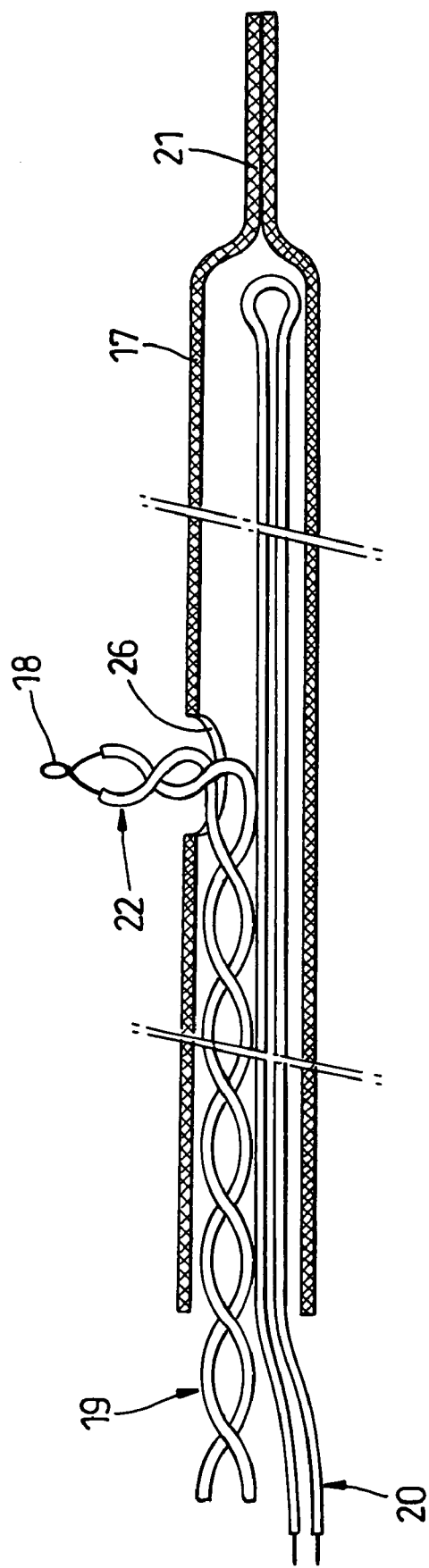
FIG. 2 is a sectional view through a close coupled combination used in the stand off of FIG. 1.

The stand off 14 includes two main elements, a resistive or insulating cylinder 15, through which gas feeds (not shown) are drilled and a close coupled helically wound combination, generally indicated at 16. The combination 16 comprises an RF conductive tube 17 in the form of a braided cable; a thermocouple 18 having twisted pair supply cables 19 and a heater element 20 in the form of a cable loop or pair 20. The cables 19 and 20 extend into and along the conductive tube 17. In the case of the heated pair 20 it extends substantially along the length of the tube 17, whereas the thermocouple twisted pair 19 extend to an opening 26 in the tube 17 through which they project to connect to the thermocouple 18. As can best be seen in FIG. 1, the opening 26 is adjacent, approximately, the mid point of the cylinder 15 so that a meaningful temperature can be sensed using a single sensor. It will be understood that the detected temperature is used to control the heater and hence the temperature of the gas flowing through the tube 15. The end 21 of the tube 17 which is to be connected to the RF live part is closed off to prevent RF entering the inside of the tube 17. It will be noted that as the pairs 19 and 20 are substantially contained within the tube 17 so that they are close coupled and respectively co-extensive, any voltage induced in one part of the pair by RF in the tube 17 will be balanced by an equal and opposite voltage induced in the other part of the pair. The projecting part of the thermocouple pair indicated at 22 will produce a small unbalanced voltage, but because the length of 22 is so small, the effect of the voltage will be negligible.

Returning to FIG. 1, it will be seen that the braided cable is connected to the grounded part 10 at 23 and then wound helically about the tube 15 at a pitch selected, as mentioned above, to provide an even voltage drop off, and it is then connected, at 21 to the RF live part 11 through a DC bias block capacitor 24

It will be noted that the grounded part 10 defines a well or recess 25, which receives and surrounds the stand off 14. In the first instance this has the benefit of providing a Faraday's cage substantially around the stand off 14 and so suppresses RF transmission to other parts of the apparatus. However additionally, if the recess 25 is dimensioned so that the grounded part 10 is significantly closer to the helical winding than each turn is from the other, then the coil and the ground playing, constituted by the grounded part 10 will together act as a transmission line. As the helical winding constitutes a coiled inductor, the wave propagation along the conductor will be slowed forming the slow wave structure mentioned above with the benefits as set out. In the transmission line configuration such waves can be slowed either by increasing inductance per meter or capacitance per meter or both. Hence benefit could be further obtained by encasing the conductors in a dielectric material having a permativity greater than 1. The inductance per meter can be increased by enclosing the conductors in a loss less non-conducting magnetic material but that would be technically more challenging.

In a particular embodiment the braid might be RG58 (approximately 5 millimeter diameter) braid and PTFE insulated thermocouple and heater wires might be used. A relatively low voltage, high current can be used for the heater power with low resistance copper. Alternatively a suitable stainless steel sheathed heater, if thin enough, could also be used to form the coil with a braided sleeve over the top to pass the RF and contain the thermocouple wire.

As has previously been indicated, the important requirement is that the combination is very close coupled so that no significant net voltages will be induced in the thermocouple and heater wires. Thus a twisted trio or parallel tapes may alternatively be utilised.

What is claimed is:

1. An RF stand off including a resistive or insulating gas feed for extending between a grounded part of an apparatus and a live part and a close-coupled combination of an electrical heater, an electrical temperature sensor having supply cables and an RF conductor for extending between the grounded part and the RF live part; the combination being generally helically wound around the gas feed and the heater and/or its cables and the supply cables being respectively substantially co-extensive and close-coupled such that voltage induced by RF in one cable is substantially balanced out by an equal and opposite voltage in another.

2. A stand off as claimed in claim 1 wherein the temperature sensor projects from the close-coupled combination at or adjacent the point at which it senses temperature.

3. A stand off as claimed in claim 2 wherein the point is at or adjacent the midpoint of the stand off.

4. A stand off as claimed in claim 1 wherein the combination is in the form of a twisted trio.

5. A stand off as claimed in claim 1 wherein the combination is formed by parallel tapes.

6. A stand off as claimed in claim 1 wherein the RF conductor is formed at least in part by a conductive tube and the electrical heater and the sensor and cables are at least in part contained therein.

7. A stand off as claimed in claim 6 wherein the end of the tube which is to be connected to the RF live part is closed.

8. A stand off as claimed in claim 7 wherein the tube is in the form of a braided cable.

9. A stand off as claimed in claim 1 furthering including a DC bias blocking capacitor for connection in series between the RF conductor and the RF live part.

10. An RF stand off including a resistive or insulating gas feed for extending between a grounded part of an apparatus and a live part and a close-coupled combination of an electrical heater, an electrical temperature sensor having supply cables and an RF conductor for extending between the grounded part and the RF live part; the combination being generally helically wound around the gas feed and the heater and/or its cables and the supply cables being respectively substantially co-extensive and close-coupled such that voltage induced by RF in one cable is substantially balanced out by an equal and opposite voltage in another wherein the temperature sensor projects from the close-coupled combination at or adjacent the point at which it senses temperature; the point is at or adjacent the midpoint of the stand off; and combination is in the form of a twisted trio.

11. A stand off as claimed in claim 10 wherein the RF conductor is formed at least in part by a conductive tube and the electrical heater and the sensor and cables are at least in part contained therein.

12. A stand off as claimed in claim 11 wherein the end of the tube which is to be connected to the RF live part is closed.

13. A stand off as claimed in claim 11 wherein the tube is in the form of a braided cable.

14. RF apparatus including a grounded part and an RF live part interconnected by a stand off as claimed in claim 1.

15. Apparatus as claimed in claim 14 wherein the grounded part defines a recess or well for receiving the RF stand off and thereby shielding it.

16. Apparatus as claimed in claim 15 wherein the grounded part and RF stand off together form a transmission line.

17. RF apparatus including a grounded part and an RF live part interconnected by a stand off as claimed in claim 10.

18. Apparatus as claimed in claim 17 wherein the grounded part defines a recess or well for receiving the RF stand off and thereby shielding it.

19. Apparatus as claimed in claim 16 wherein the grounded part and RF stand off together form a transmission line.

* * * * *